(12) United States Patent
Sasahara

(10) Patent No.: US 7,598,537 B2
(45) Date of Patent: Oct. 6, 2009

(54) SEMICONDUCTOR DEVICE

(75) Inventor: Katsuhiko Sasahara, Tokyo (JP)

(73) Assignee: Oki Semiconductor Co., Ltd, Tokyo (JP)

( * ) Notice: Subject to any disclaimer, the term of this patent is extended or adjusted under 35 U.S.C. 154(b) by 0 days.

(21) Appl. No.: 10/676,071

(22) Filed: Oct. 2, 2003
(Under 37 CFR 1.47)

(65) Prior Publication Data
US 2004/0135229 A1  Jul. 15, 2004

(30) Foreign Application Priority Data
Oct. 7, 2002  (JP) .............................. 2002-293148

(51) Int. Cl.
*H01L 29/72* (2006.01)
(52) U.S. Cl. ..................... 257/173; 257/529; 361/111; 365/184.04
(58) Field of Classification Search ................ 257/500, 257/529, 532, 665, 168, 173, 355, 328; 361/111; 365/184.04
See application file for complete search history.

(56) References Cited

U.S. PATENT DOCUMENTS 6,154,388 A * 11/2000 Oh ......................... 365/185.04
6,556,409 B1 * 4/2003 Chittipeddi et al. .......... 361/111

FOREIGN PATENT DOCUMENTS

JP  10-321742  12/1998
JP  11-145394  5/1999

* cited by examiner

*Primary Examiner*—Edward Wojciechowicz
(74) *Attorney, Agent, or Firm*—Kubotera & Associates, LLC

(57) ABSTRACT

A semiconductor device comprises one or two semiconductor chips, each including an input circuit having a wiring (3) for connecting an input pad (2) to an inner circuit, a first electrostatic protection element (1) electrically connected to the wiring, a second electrostatic protection element (1), and a fuse (4) provided between the wiring (3) and second electrostatic protection element (1). When the semiconductor device has one semiconductor chip, the wiring (3) and second electrostatic protection element (1) are connected to each other through the fuse (4), and when the semiconductor device has said two semiconductor chips, the fuse (4) is disconnected so that the second electrostatic protection element (1) is electrically disconnected from the wiring (3).

13 Claims, 14 Drawing Sheets

SEMICONDUCTOR DEVICE

BACKGROUND OF THE INVENTION

1. Field of the Invention

This invention relates to a semiconductor device having a semiconductor chip suitable for multi-chip package and a method of setting the capacity of an input pin for the semiconductor chip.

2. Description of the Related Art

Japanese Patent Application Number 10-321742 (hereinafter "related art") describes that although a single chip package having only one chip per package has been a main stream in the field of DRAM, a multi-chip package having a plurality of chips per package has been developed recently to meet the requirements of a large capacity DRAM.

The related art proposed that in a double mounted type semiconductor device, an electrostatic protection circuit was provided in either a single semiconductor chip or two decentralized semiconductor chips.

The input pin capacity of a DRAM is specified that, for example, the maximum value is 5 PF and the minimum capacity is 2.5 PF. The input pin capacity consists of the package capacity that is determined according to the factors of a package and the chip capacity that is determined according to the factors of chips.

Since the package capacity is more difficult to change than the chip capacity, the related art proposed to adjust the chip capacity to meet the specifications.

FIG. 14 shows a conventional input circuit of a semiconductor chip. N-channel MOS transistors are used in the related art; however, CMOS transistors are used in FIG. 14 for convenience of comparison with the present invention.

The input circuit comprises an electrostatic protection element 1, an input pad 2, and a wiring 3. The electrostatic protection element 1 is a capacitor of CMOS transistors in which a P-channel MOS transistor Pch and an N-channel MOS transistor Nch are connected to each other.

The electrostatic protection element 1 is provided so as to prevent an inner circuit from being broken down by a high voltage that is caused by static electricity through the input pad 2 and the wiring 3.

The chip capacity of the input pin capacity is the sum of junction capacities between a source and a drain of the P-channel MOS transistor Pch and the N-channel MOS transistor Nch. Since the chip capacity is in proportion to the junction area of the pn junction, the input pin capacity is determined by adjusting the junction area at the stage of design.

However, when a multi-chip package is developed using chips which have the chip capacity for a single chip package, the sum of the chip capacity exceeds the upper limit of the specified chip capacity for the multi-chip package because the specified input pin capacity of the multi-chip package is the same as that of the single chip package. The chip capacity is constant so that the added capacities were unable to be changed according to the number of the chips used in the multi-chip package.

BRIEF SUMMARY OF THE INVENTION

According to the invention, in order to solve the above problem, fuses are provided in the input circuit between the electrostatic protection elements and the wirings for connecting the input pad and the inner circuit and a predetermined fuse is disconnected according to the number of semiconductor chips mounted in the multi-chip package.

DESCRIPTION OF THE PREFERRED EMBODIMENT

Figure 1:
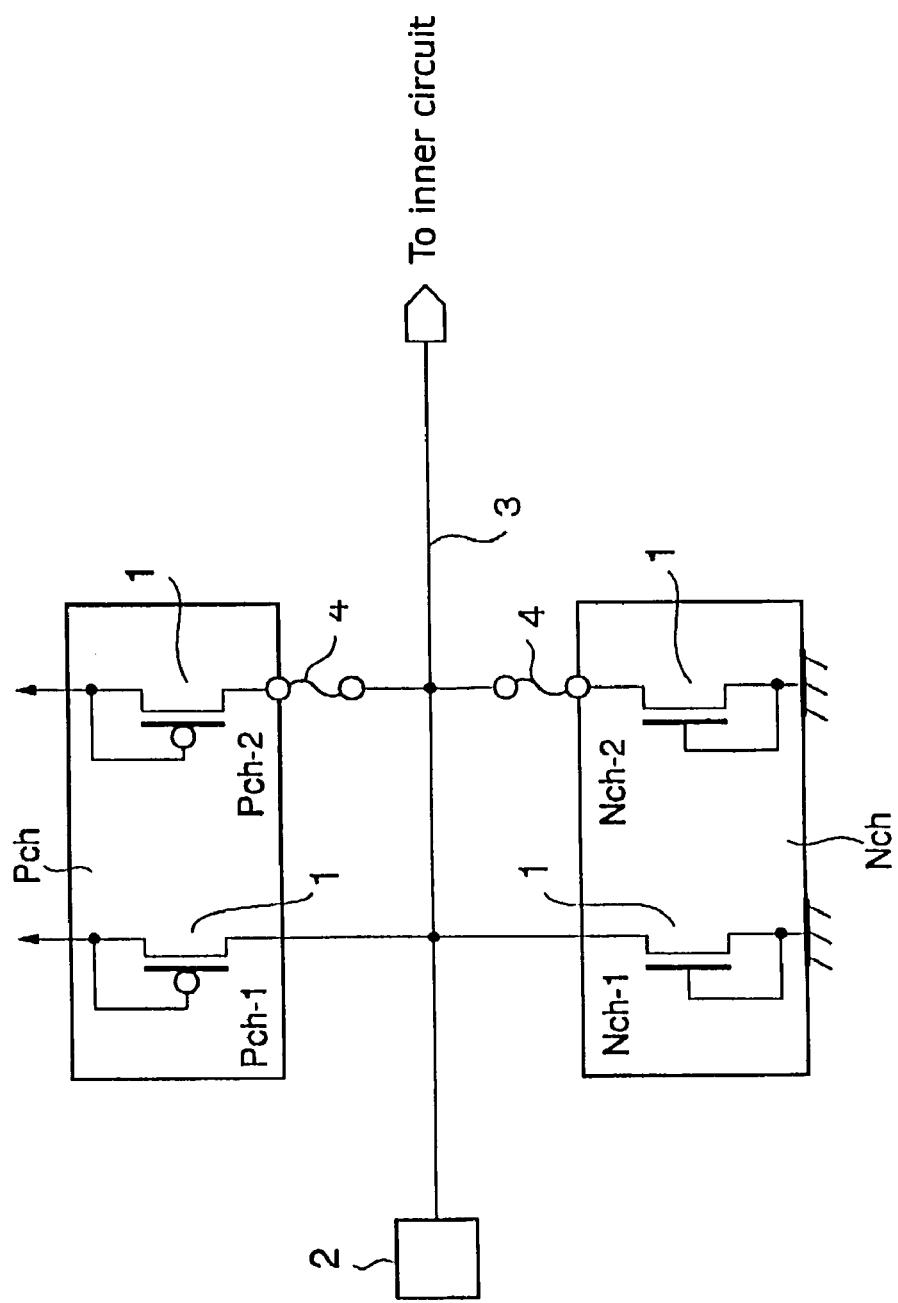
FIG. 1 is a schematic diagram of an input circuit according to the first embodiment of the present invention.

In FIG. 1, an input circuit comprises an electrostatic protection element 1, an input pad 2, wiring 3, and a fuse 4. The electrostatic protection element 1 is constructed such that the capacitor made by two P-channel MOS transistors Pch-1 and Pch-2 that each has a half of the chip capacity of the input pin capacity, is equal to the conventional capacitor made by one P-channel MOS transistor Pch.

Similarly, N-channel MOS transistors Nch-1 and Nch-2 make a capacitor in the input circuit. Thus, the capacitors according to the invention are made by CMOS transistors. However, the capacitor made by only N-channel or P-channel MOS transistor may be used.

The input pad 2 is an input terminal which is connected to a pin, and the wiring 3 connects the input pad 2 and an inner circuit. The input pad 2 and the wiring 3 are identical to conventional ones. The fuse 4 is formed by the same material as a metal wire, such as aluminum, in the same way as for a wiring pattern. An additional element, such as a diode, may be included in the input circuit.

A first electrostatic protection element 1 formed by the transistors Pch-1 and Nch-1 is connected to the wiring 3. A second electrostatic protection element 1 formed by the transistors Pch-2 and Nch-2 is disposed in the vicinity of the wiring 3. The fuse 4 is provided between the wiring 3 and the second electrostatic protection element 1.

The transistors Pch-1 and Pch-2 have equal capacitance. That is, the chip capacity of the input pin capacity of the package is divided equally into the two by dividing a half, the pn junction area between the source and drain at the stage of design. The same thing is applicable to the capacity formed by the transistors Nch-1 and Nch-2.

When a semiconductor chip comprising the above-described input circuit is used in single chip package, only one chip formed by the transistors Pch-1, Pch-2, Nch-1, and Nch-2 is mounted in a package. In the single chip package, since the fuse 4 is not disconnected, the second electrostatic protection element 1 formed by the transistors Pch-2 and Nch-2 is electrically connected to the wiring 3.

Figure 2:
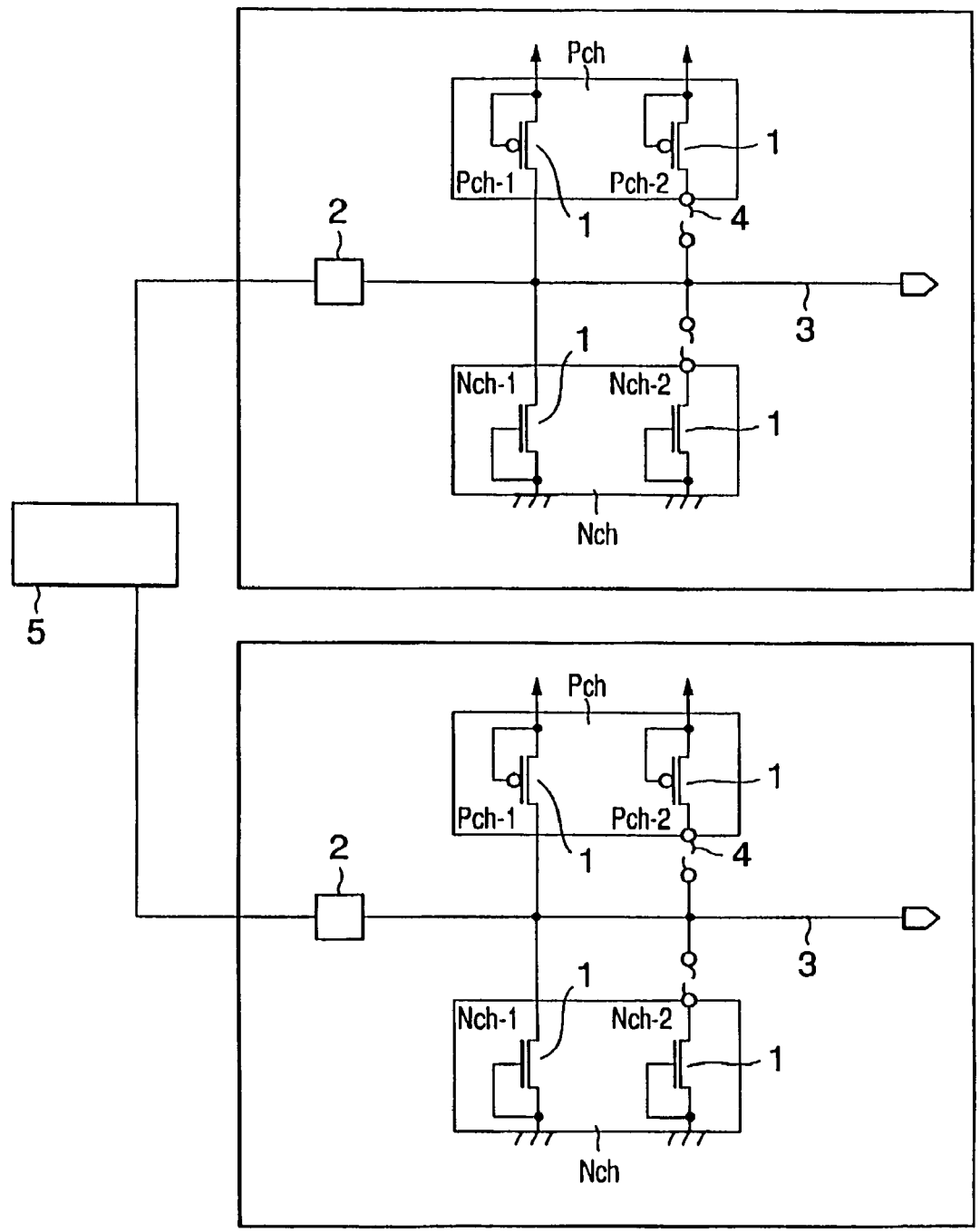
FIG. 2 is a schematic diagram of the first embodiment of the invention.

In FIG. 2, in the multi-chip package (two chip are mounted in a package), the fuses 4 are disconnected to electrically disconnect the second electrostatic protection element 1 formed by the transistors Pch-2 and Nch-2 so that only the first electrostatic protection element 1 formed by the transistors Pch-1 and Nch-1 is used.

In the multi-chip package, the respective input pads 2 of the two chips having the disconnected fuse 4 are connected to a common terminal 5. Then, the two chips are mounted in the package to make the semiconductor device of the multi-chip package.

When the two semiconductor chips each having the chip capacity of a half value and the disconnected fuses 4 are mounted in the package, the input pin capacitance of the package does not exceed the upper limit of the specification.

The disconnection of the fuse 4 is performed by laser after the treatment of a wafer. It is recommended that the pattern width of the fuse 4 is made small or the pattern film is made thin so that the disconnection is made easy.

Figure 3:
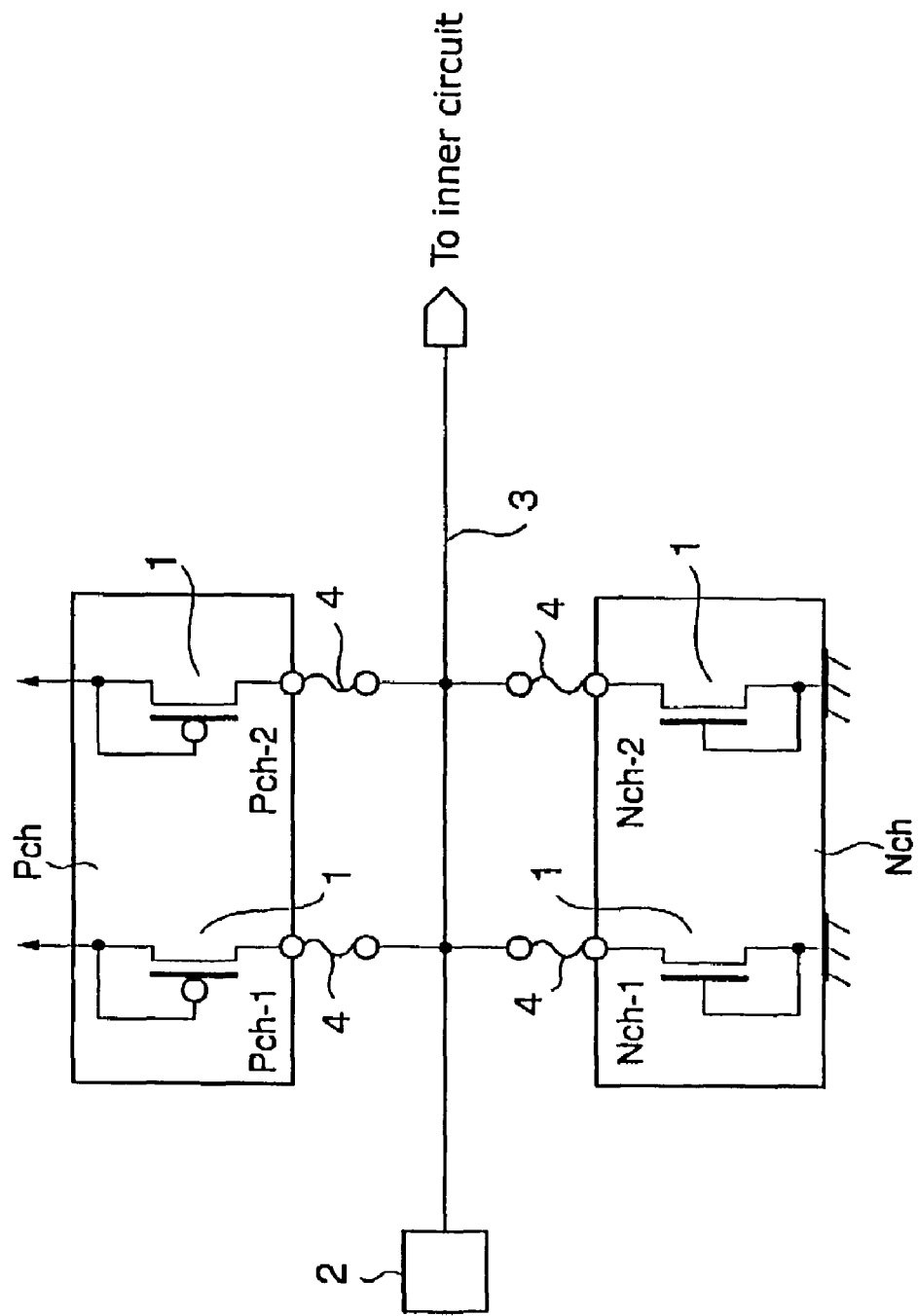
FIG. 3 is a schematic diagram of an input circuit according to the second embodiment of the present invention.

In FIG. 3, the second embodiment of the invention has the same structure as in the first embodiment except that the first electrostatic protection element 1 formed by the transistors Pch-1 and Nch-1 is also connected to the wiring 3 through the fuse 4.

It is required that at least one of the electrostatic protection elements 1 is connected to the input pad 2 to prevent the breakdown of the inner circuit. In the second embodiment, all of the electrostatic protection elements 1 are connected to the wiring 3 through the respective fuses 4 so that any fuse 4 can be disconnected.

Figure 4:
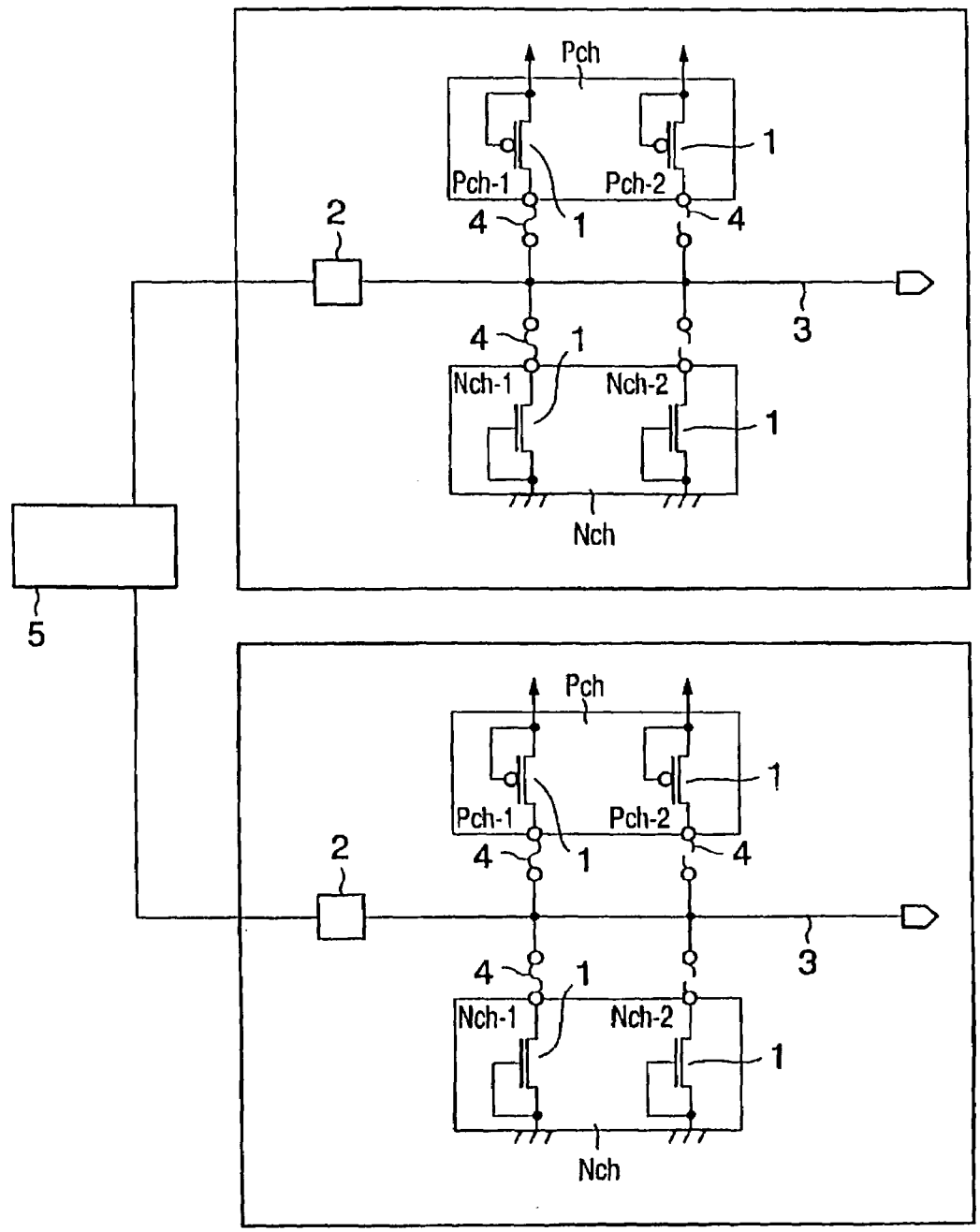
FIG. 4 is a schematic diagram of the second embodiment of the invention.

In FIG. 4, one of two pairs of the fuses 4 of each chip in the multi-chip package is disconnected and the other pair of the fuses 4 are not disconnected so that the corresponding electrostatic protection element 1 is electrically connected to the wiring 3 through the fuses 4.

Figure 5:
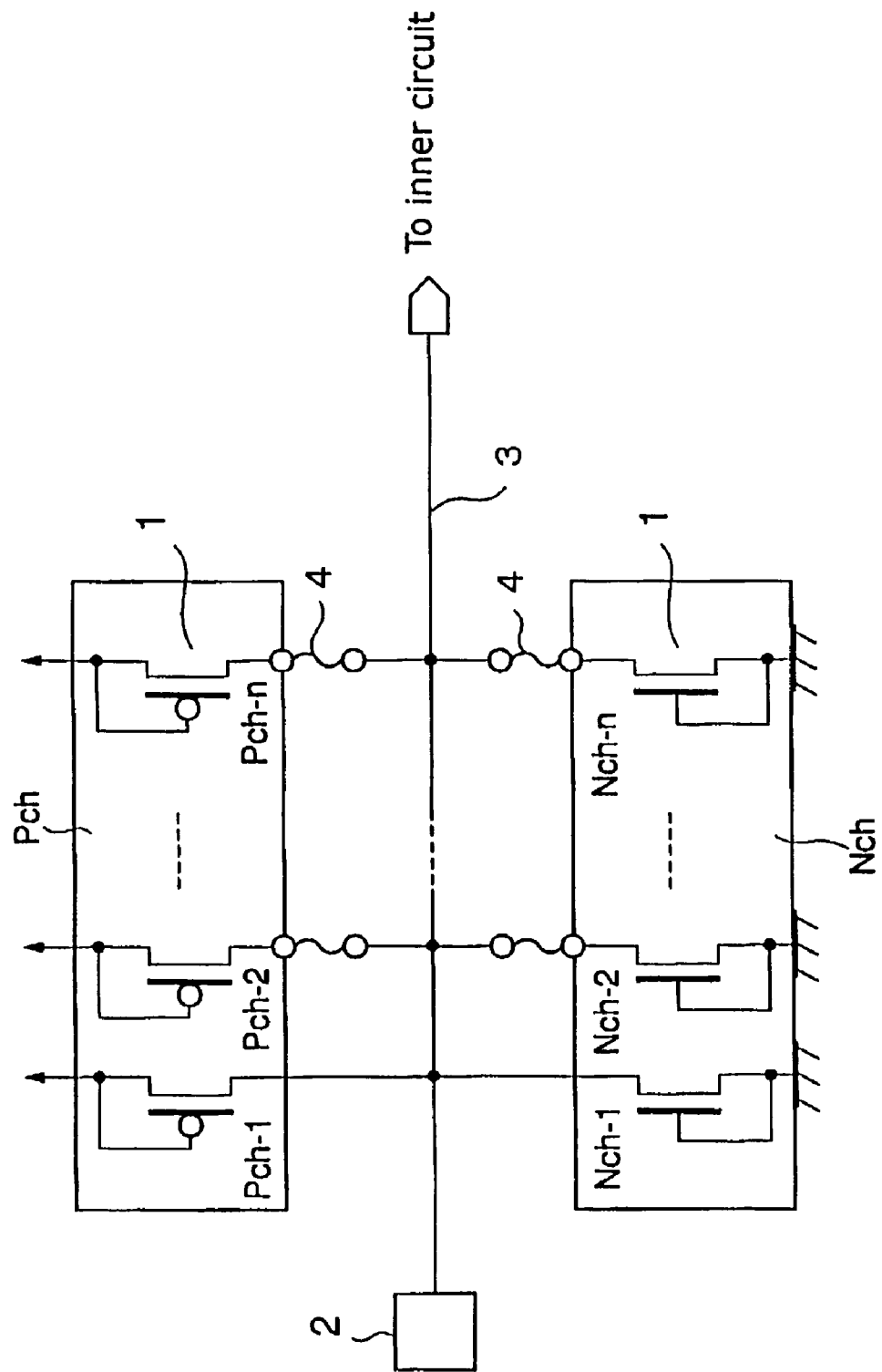
FIG. 5 is a schematic diagram of an input circuit according to the third embodiment of the present invention.

In the first and second embodiments, two chips are mounted in a package. In the third embodiment shown in FIGS. 5 and 6, the chips in the number of n are mounted in a package (n is an integer larger than 2). In the chips for the third embodiment, the fuses 4 are provided for all the electrostatic protection elements 1 except for the first electrostatic protection element 1.

In the third embodiment, the chip capacity is equally divided into the number of n. That is, the junction areas of the respective transistors Pch-1 to Pch-n are set at 1/n of the junction area of the conventional transistor Pch for the single chip package. Similarly, the junction areas of the respective transistors Nch-1 to Nch-n are set at 1/n of the junction area of the conventional transistor Nch.

When this semiconductor chip is used in the single chip package, one chip is mounted in a package without disconnecting any fuses 4 so that the electrostatic protection elements 1 in the number of n (from the first to n-th electrostatic protection elements 1) are electrically connected to the wiring 3.

Figure 6:
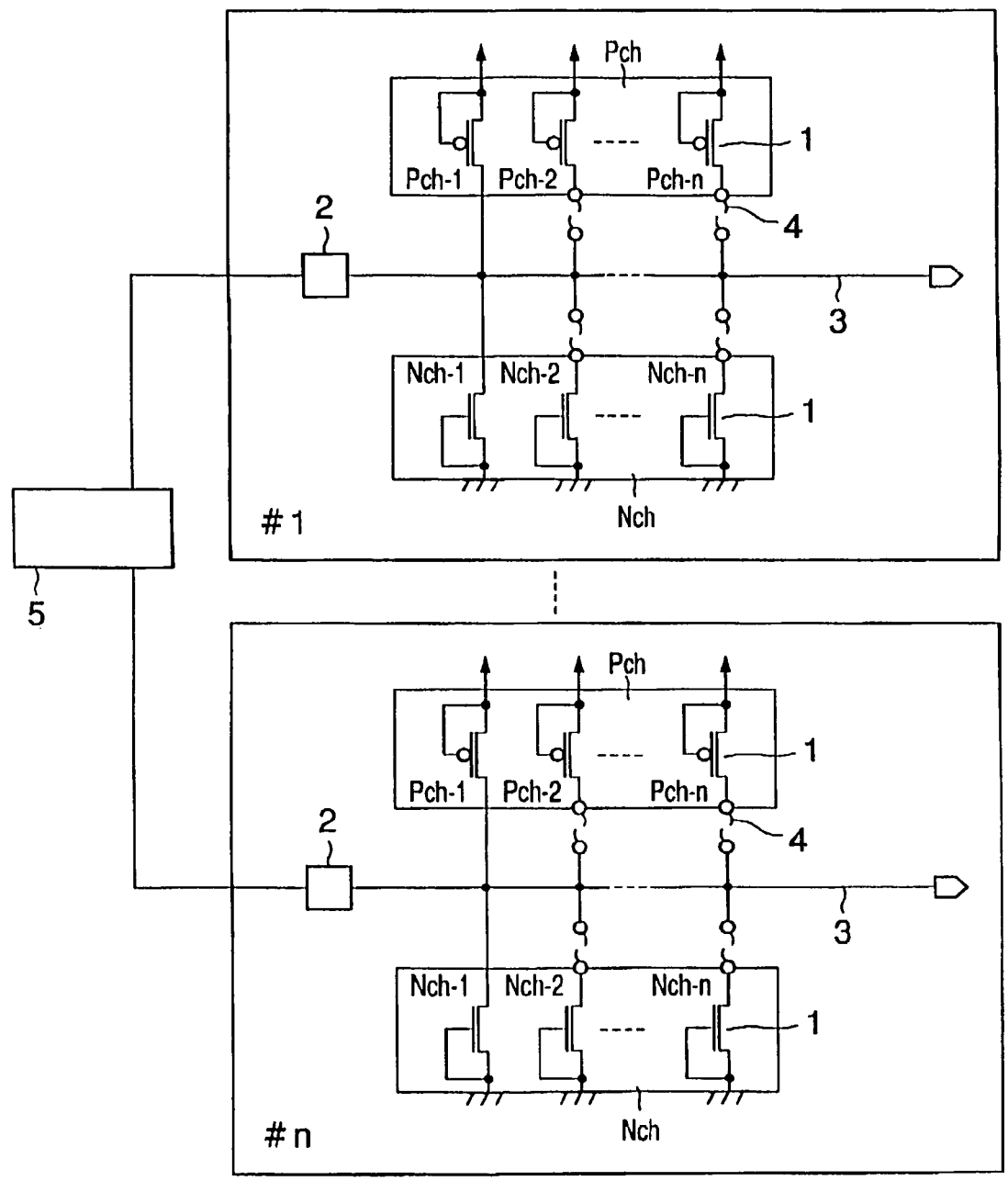
FIG. 6 is a schematic diagram of the third embodiment of the invention.

In FIG. 6, when this semiconductor chip is used in the multi-chip package, the chips in the number of n are mounted in a package with disconnecting all pairs of the fuses 4 so that the electrostatic protection elements 1 in the number of n−1 (from the second to n-th electrostatic protection elements 1) are electrically disconnected from the wiring 3 and only the first electrostatic protection element 1 is electrically connected to the wiring 3. The respective input pads of the chips in the number of n are connected to the common terminal 5 of the package.

Figure 7:
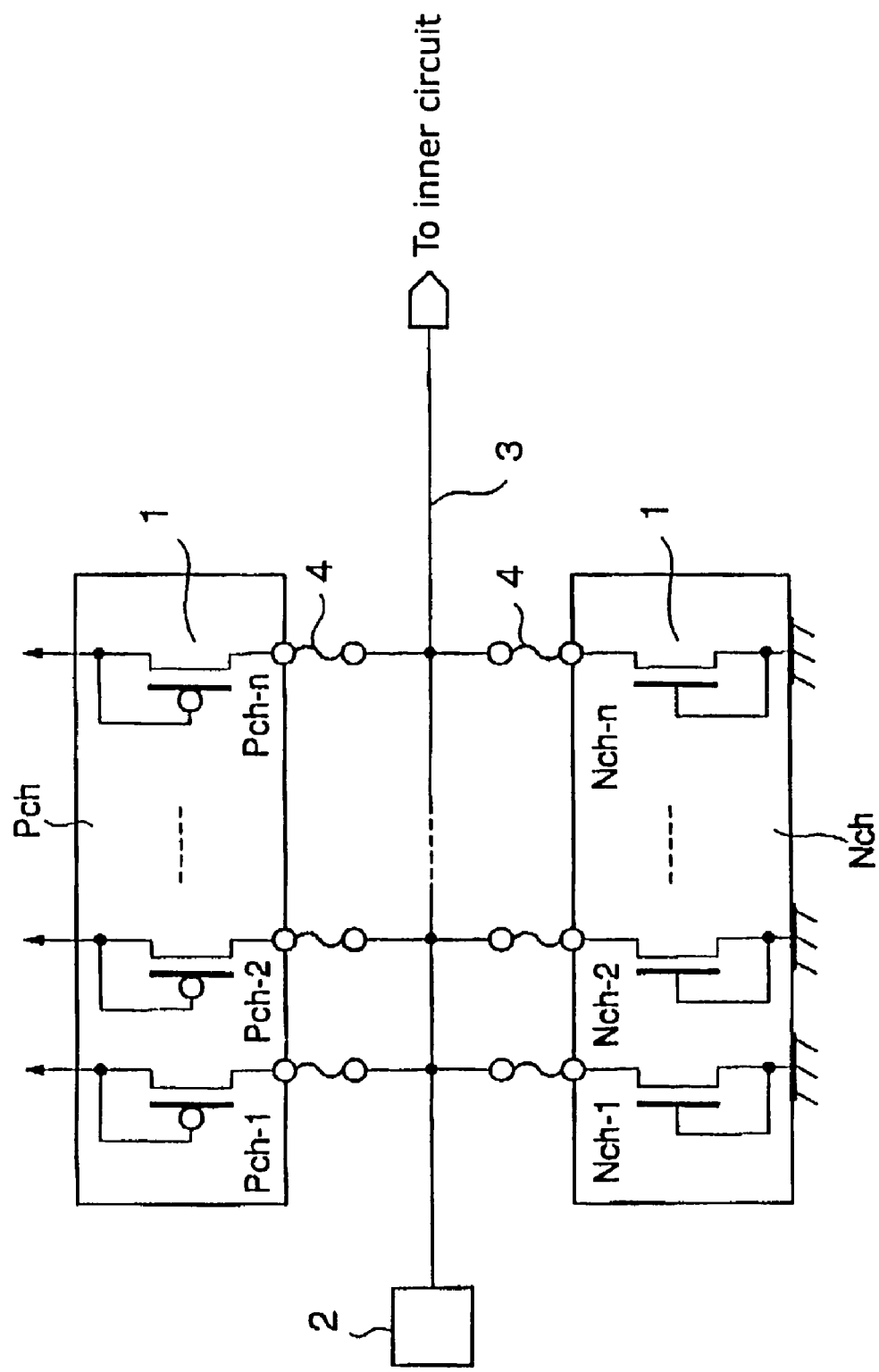
FIG. 7 is a schematic diagram of an input circuit according to the fourth embodiment of the present invention.

In FIG. 7, the chip for the fourth embodiment has the same structure except that the first electrostatic protection element 1 is also provided with a pair of the fuses 4 so that the transistors Pch-1 and Nch-1 are connected to the wiring 3 through the fuses 4.

Figure 8:
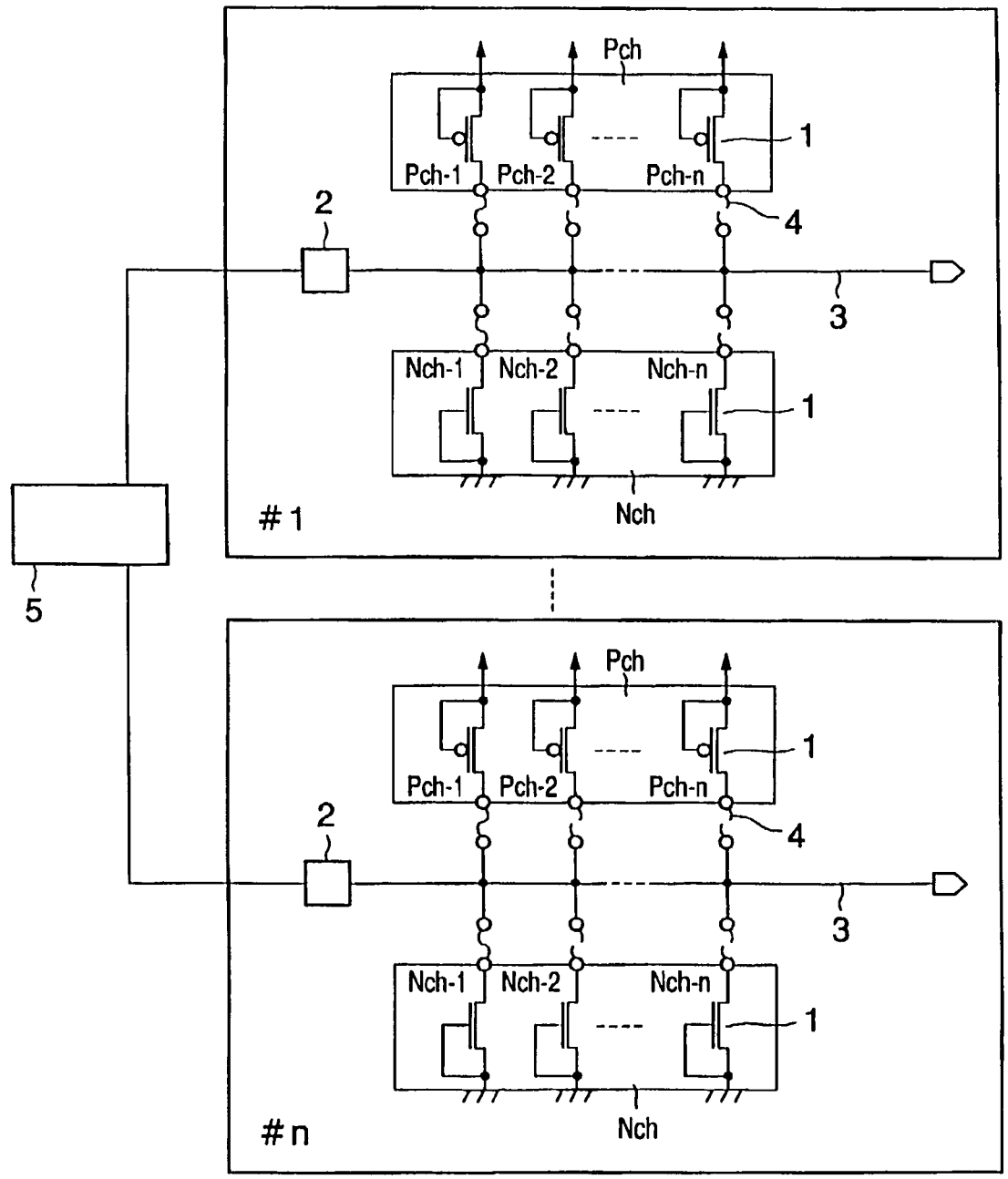
FIG. 8 is a schematic diagram of the fourth embodiment of the invention.

In FIG. 8, when the chip is used for the multi-chip package, all the pairs of the fuses 4 are disconnected but only the pair of fuses 4 of the first electrostatic protection element 1 is not disconnected. It is easy to determine which pair of the fuses 4 is disconnected, by changing the program for the disconnection by laser. Accordingly, it is not necessary that the fuses 4 of the first electrostatic protection element 1 is always used, but any pair of fuses can be used.

Figure 9:
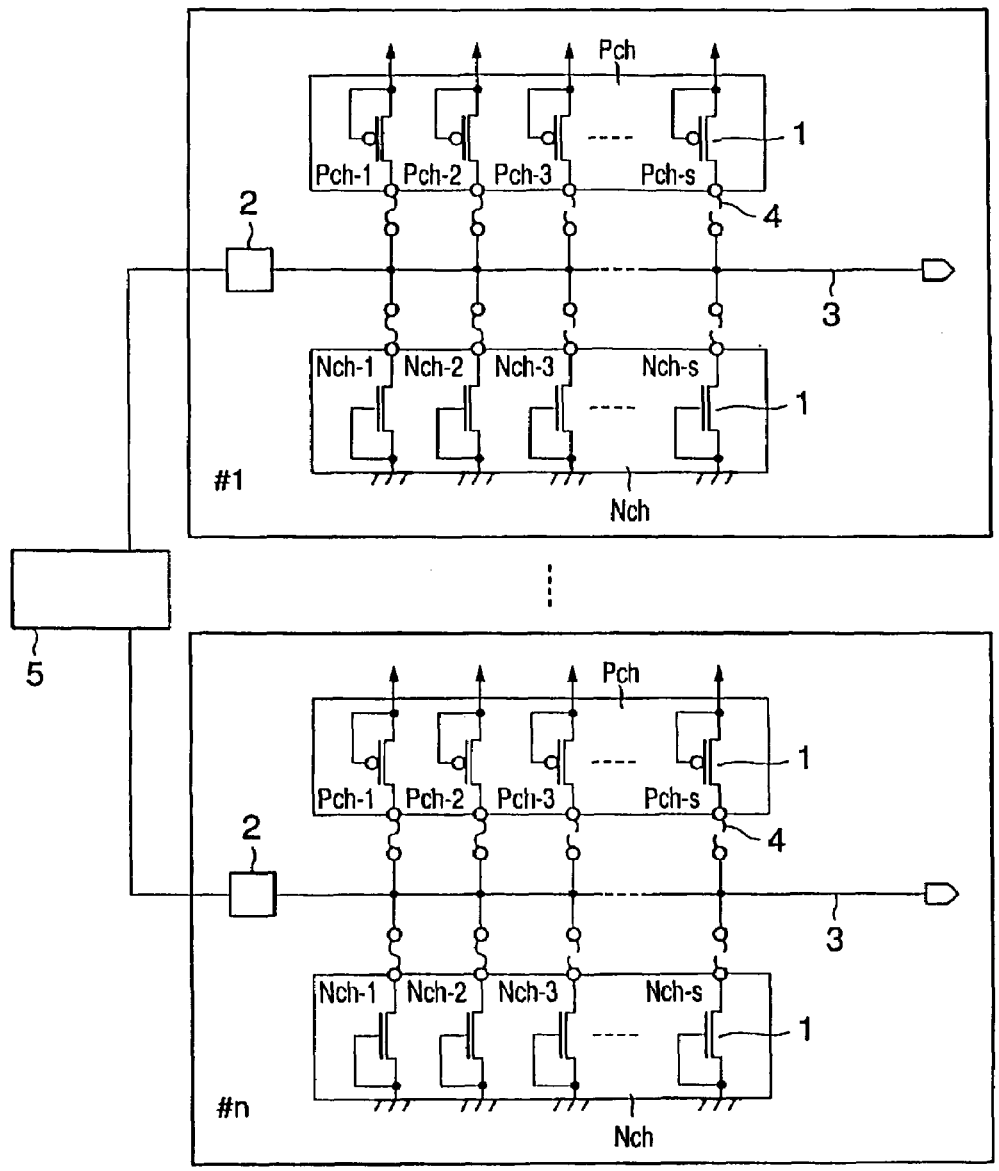
FIG. 9 is a schematic diagram of the fifth embodiment of the invention.

In the fourth embodiment, the first electrostatic protection element 1 is not disconnected. In the fifth embodiment (FIG. 9), however, the fuses 4 of the first and second electrostatic protection elements are disconnected and the fuses 4 of the third to s-th electrostatic protection elements 1 are disconnected. The respective pads 2 are connected to the common terminal 5 of the package.

When the chips in the number of n are mounted, it is necessary that the chip capacity of the input pin capacity of each chip is divided by the number of s which is larger than n, for example, 2n. Otherwise, there is the risk that the multi-chip package has the input pin capacity exceeding the specification.

When the chips in the number smaller than n, for example, n−1, are mounted, the chip capacity of the input pin capacity may be divided by s (=n). In any case, it is required to meet the specification of the input pin capacity of the package. The transistors Pch-1 and Nch-1 may be directly connected to the wiring 3 without fuse 4 as shown in FIG. 6.

As stated above, according to the first to fifth embodiments, the input circuit of the chip comprises the electrostatic protection elements which are connected to the wiring through fuses and have the chip capacity divided by the number of chips. Since the fuses predetermined by the number of chips mounted in a package are disconnected, when a plurality of the chips having such disconnected fuses are mounted in a package, the multi-chip package meets the specified input pin capacity.

Also, when the chip is used for the single chip package, all the electrostatic protection elements may be used without disconnecting any fuses. Accordingly, the semiconductor chip can be used for both the multi-chip package and the single chip package.

Figure 10:
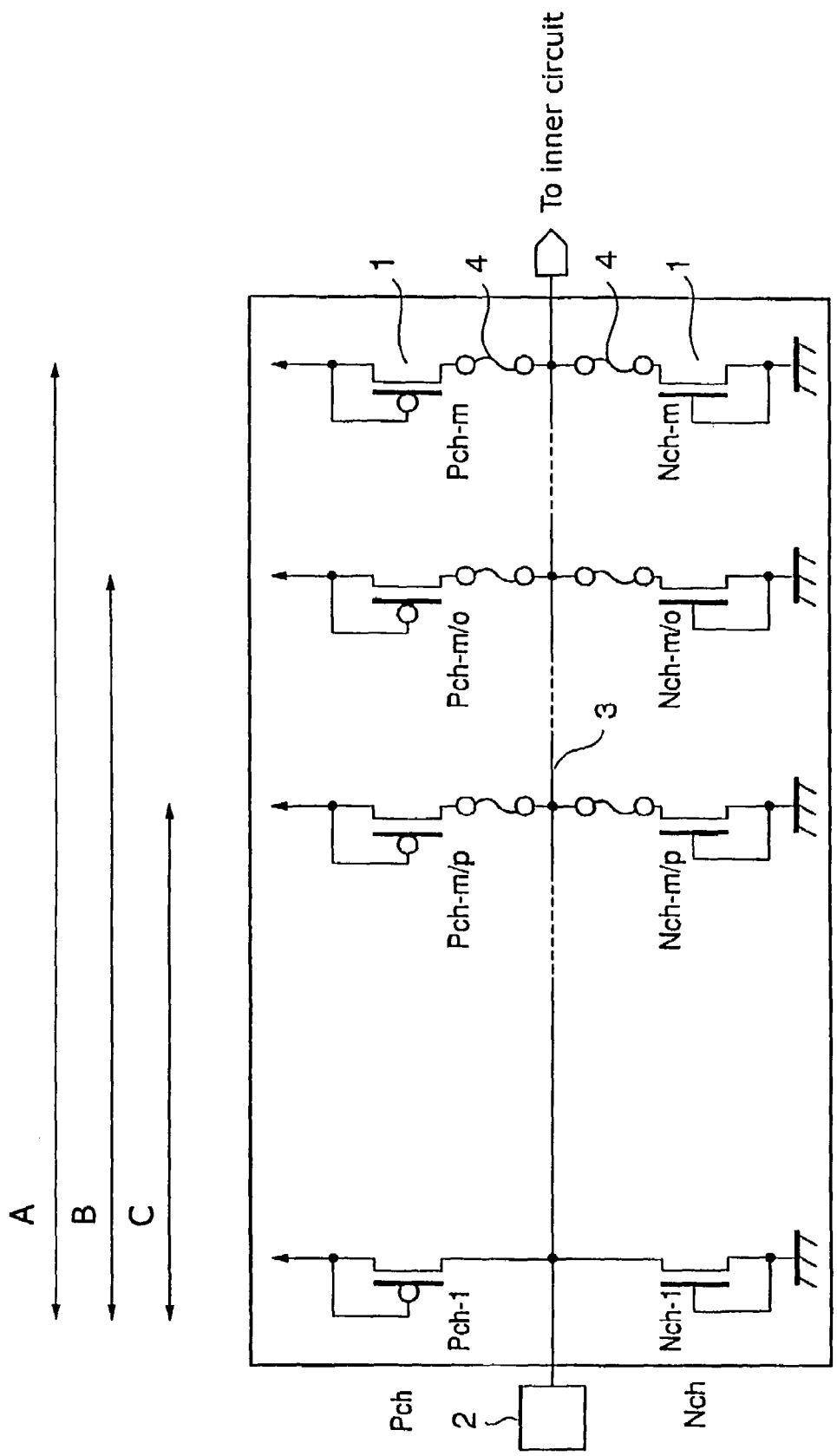
FIG. 10 is a schematic diagram of the sixth embodiment of the invention.

In FIG. 10, according to the sixth embodiment, the chip capacity is divided by the number of m or the lowest common multiple of the numbers of o and p, which are the numbers of the chips supposed to be mounted in a package. By doing so, a semiconductor chip useful for a plurality of multi-chip packages can be produced.

When the chips are used commonly for, for example, two multi-chip packages, o-chip package (chips in the number of o are mounted in a package) and p-chip package (chips in the number of p are mounted in a package), the chip capacity of the input pin capacity is divided by the number of m, which is the lowest common multiple of the numbers of o and p. That is, the junction area for producing the capacity equal to that of the conventional transistors Pch and Nch for the single chip package is divided equally by the number of m. Accordingly, the junction areas of the respective transistors Pch-1 to Pch-m and Nch-1 to Nch-m are 1/m of the junction area of the transistors Pch and Nch, respectively, for the single chip package.

The transistors Pch-1 and Nch-1 forming the first electrostatic protection element 1 are directly connected to the wiring 3. The remaining transistors Pch-2 to Pch-m and Nch-2 to Nch-m forming the second to m-th electrostatic protection elements 1 are connected to the wiring 3 through fuses 4.

When the semiconductor chip having the above structure is used in the single chip package (SCP), one chip is mounted in a package without disconnecting any fuse 4 so that all the electrostatic protection elements 1 in the number of m shown by an arrow A (from the first to m-th electrostatic protection elements 1) are electrically connected to the wiring 3.

When the chips in the number of o are mounted in a multi-chip package, the fuses 4 for the first to m/o-th electrostatic protection elements 1 shown by an arrow B are not disconnected and the fuses 4 for the (m/o+1)th to m-th electrostatic protection elements 1 are disconnected.

When the chips in the number of p are mounted in a multi-chip package, the fuses 4 for the first to m/p-th electrostatic protection elements 1 shown by an arrow C are not disconnected and the fuses 4 for the (m/p+1)th to m-th electrostatic protection elements 1 are disconnected.

More specifically, if o is two and p is three, m is six. Accordingly, when the chips in the number of o or two chips are mounted, the fuses 4 for the first to third electrostatic protection elements 1 are not disconnected and the fuses 4 for the fourth to sixth electrostatic protection elements 1 are disconnected so that only the transistors Pch-1 to Pch-3 and Nch-1 to Nch-3 are used. When the chips in the number of p or three chips are mounted, the fuses 4 for the first to second electrostatic protection elements 1 are not disconnected and the fuses 4 for the third to sixth electrostatic protection elements 1 are disconnected so that only the transistors Pch-1 to Pch-2 and Nch-1 to Nch-2 are used.

Figure 11:
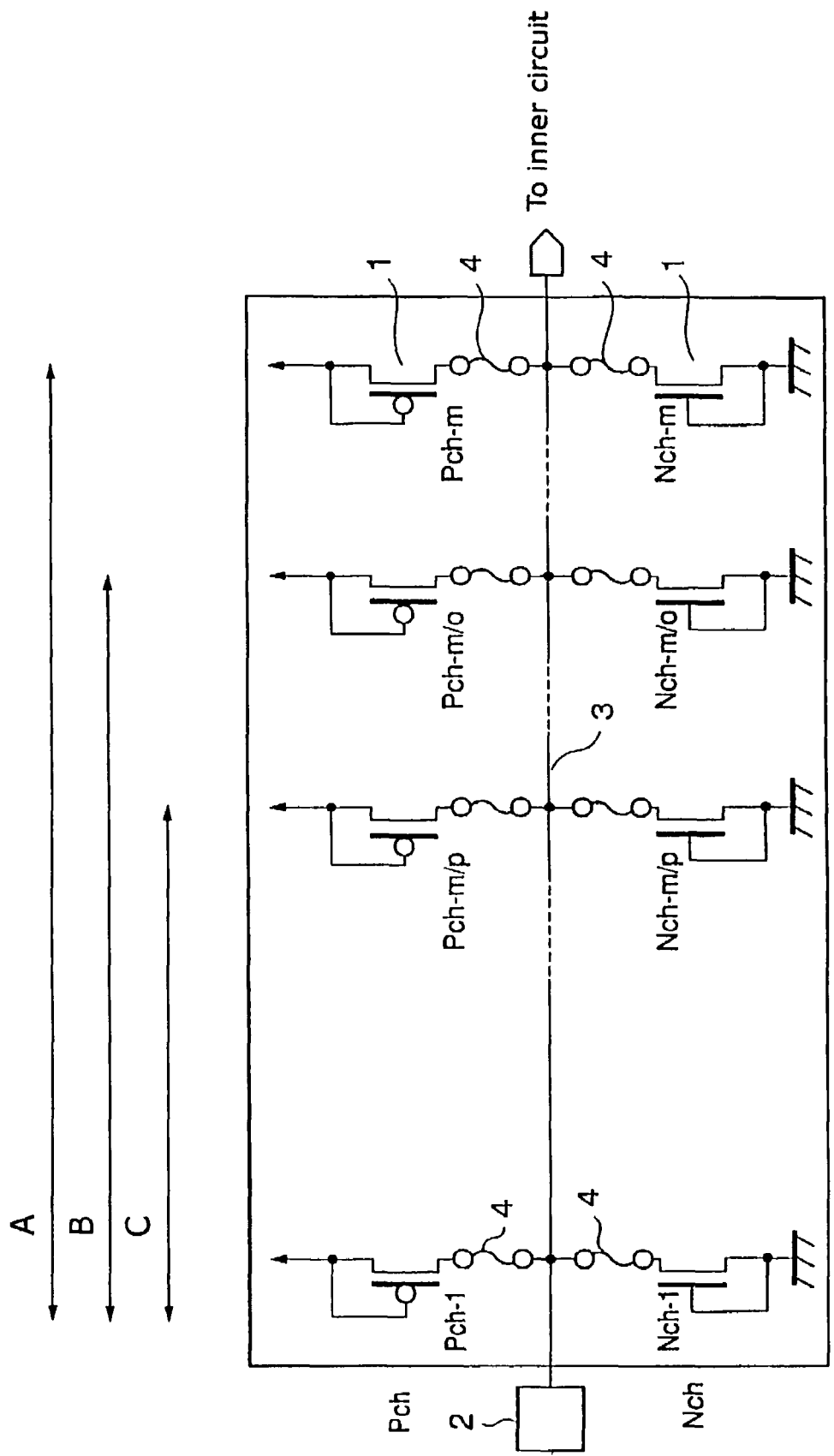
FIG. 11 is a schematic diagram of the seventh embodiment of the invention.

In FIG. 11, an input circuit according to the seventh embodiments has the same structure as in the sixth embodiment except that the transistors Pch-1 and Nch-1 forming the first electrostatic protection element 1 are connected to the wiring 3 through fuses 4.

When the semiconductor chip having the above structure is used in the single chip package (SCP), one chip is mounted in a package without disconnecting any fuse 4 so that all the electrostatic protection elements 1 in the number of m shown by an arrow A (from the first to m-th electrostatic protection elements 1) are electrically connected to the wiring 3.

When the chips in the number of o are mounted in a multi-chip package, the fuses 4 for the first to m/o-th electrostatic protection elements 1 shown by an arrow B are not disconnected and the fuses 4 for the (m/o+1)th to m-th electrostatic protection elements 1 are disconnected.

When the chips in the number of p are mounted in a multi-chip package, the fuses 4 for the first to m/p-th electrostatic protection elements 1 shown by an arrow C are not disconnected and the fuses 4 for the (m/p+1)th to m-th electrostatic protection elements 1 are disconnected.

In the sixth embodiment, the numbers of the chips which are expected to be mounted in a package are o and p. In the eight embodiment, the numbers of the chips which are expected to be mounted in a package are o, p, and q.

Figure 12:
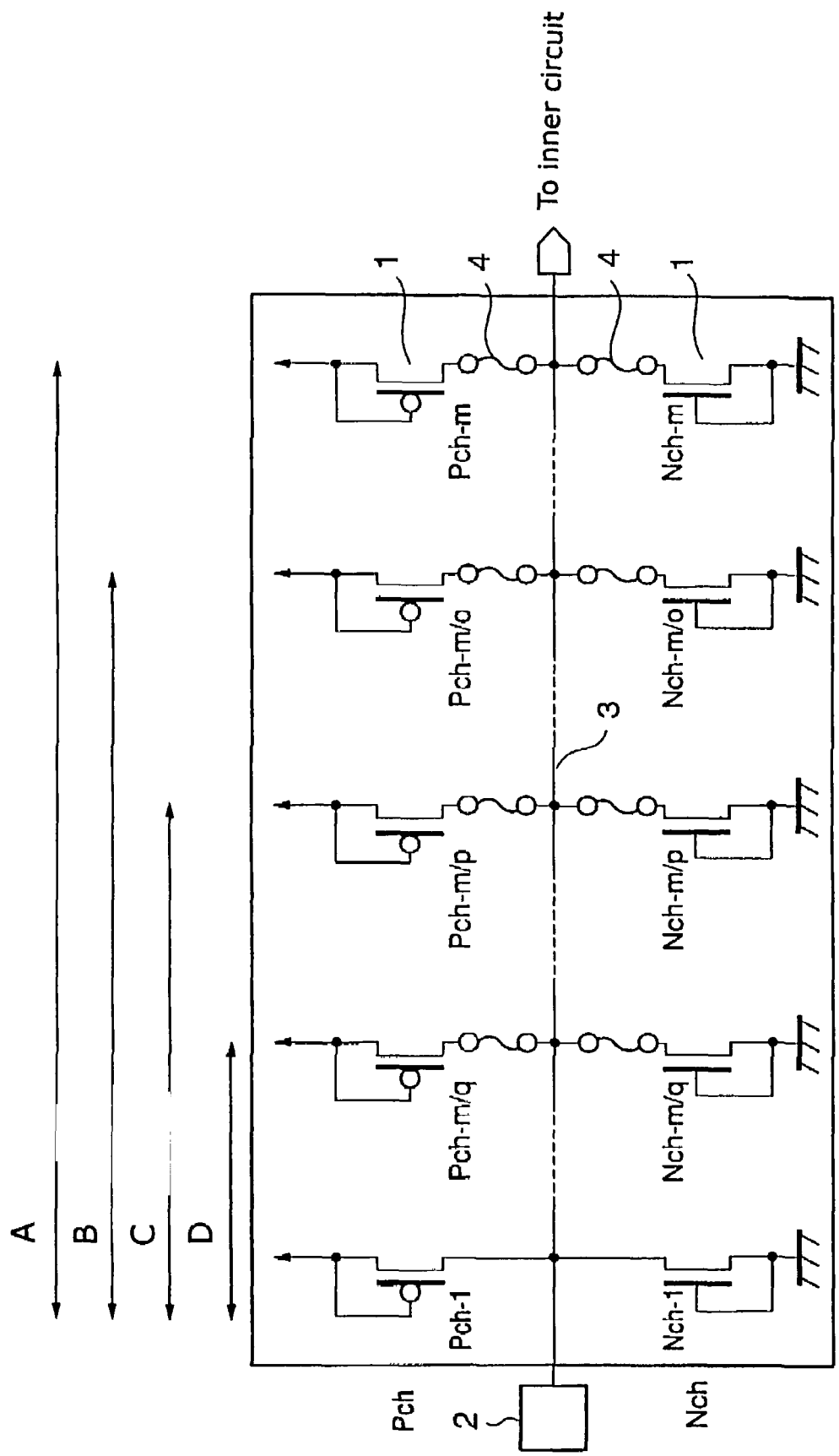
FIG. 12 is a schematic diagram of the eighth embodiment of the invention.

In FIG. 12, according to the eight embodiment, the chip capacity is divided into the number of m, which is the lowest common multiple of o, p, and q so as to produce a chip commonly used for an o-chip package (in which the chips in the number of o are mounted), p-chip package, and q-chip package.

That is, the junction area for producing the capacity equal to that of the conventional transistors Pch and Nch for the single chip package is divided equally into the number of m. Accordingly, the junction areas of the respective transistors Pch-1 to Pch-m and Nch-1 to Nch-m are 1/m of the junction area of the transistors Pch and Nch, respectively, for the single chip package.

The transistors Pch-1 and Nch-1 forming the first electrostatic protection element 1 are directly connected to the wiring 3. The other transistors Pch-2 to Pch-m and Nch-2 to Nch-m forming the second to m-th electrostatic protection elements 1 are connected to the wiring 3 through fuses 4.

When the semiconductor chip having the above structure is used in the single chip package (SCP), one chip is mounted in a package without disconnecting any fuse 4 so that all the electrostatic protection elements 1 in the number of m shown by an arrow A (from the first to m-th electrostatic protection elements 1) are electrically connected to the wiring 3.

When the chips in the number of o are mounted in a multi-chip package, the fuses 4 for the first to m/o-th electrostatic protection elements 1 shown by an arrow B are connected and the fuses 4 for the (m/o+1)th to m-th electrostatic protection elements 1 are disconnected.

When the chips in the number of p are mounted in a multi-chip package, the fuses 4 for the first to m/p-th electrostatic protection elements 1 shown by an arrow C are connected and the fuses 4 for the (m/p+1)th to m-th electrostatic protection elements 1 are disconnected.

When the chips in the number of q are mounted in a multi-chip package, the fuses 4 for the first to m/q-th electrostatic protection elements 1 shown by an arrow D are connected and the fuses 4 for the (m/q+1)th to m-th electrostatic protection elements 1 are disconnected.

More specifically, if o is two, p is three, and q is four, then m is twelve. Accordingly, when the chips in the number of o or two chips are mounted, the fuses 4 for the first to sixth electrostatic protection elements 1 are connected and the fuses 4 for the seventh to twelfth electrostatic protection elements 1 are disconnected so that only the transistors Pch-1 to Pch-6 and Nch-1 to Nch-6 are used.

When the chips in the number of p or three chips are mounted, the fuses 4 for the first to fourth electrostatic protection elements 1 are connected and the fuses 4 for the fifth to twelfth electrostatic protection elements 1 are disconnected so that only the transistors Pch-1 to Pch-4 and Nch-1 to Nch-4 are used.

When the chips in the number of q or four chips are mounted, the fuses 4 for the first to third electrostatic protection elements 1 are connected and the fuses 4 for the fourth to twelfth electrostatic protection elements 1 are disconnected so that only the transistors Pch-1 to Pch-3 and Nch-1 to Nch-3 are used.

Figure 13:
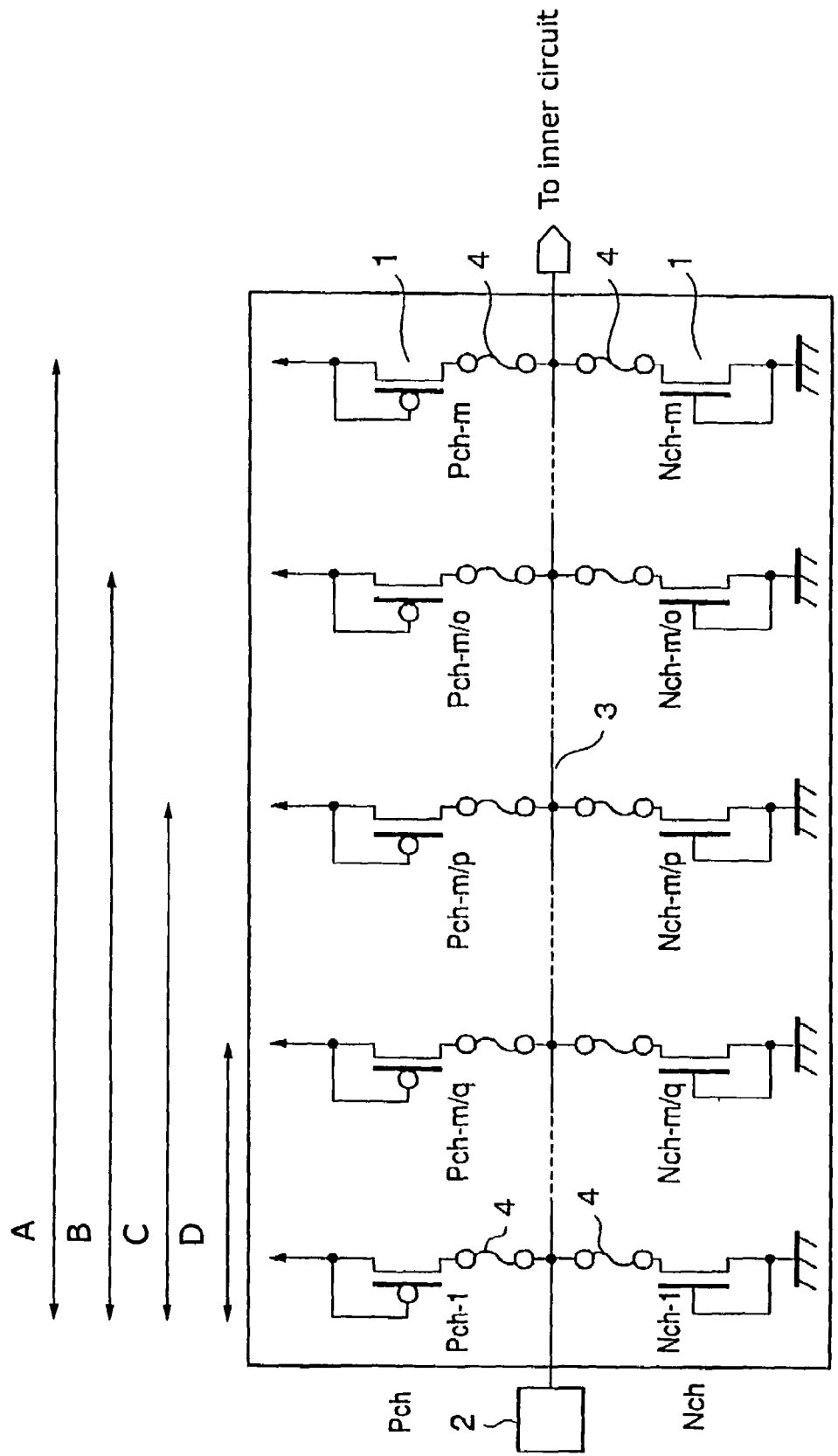
FIG. 13 is a schematic diagram of the ninth embodiment of the invention.
Figure 14:
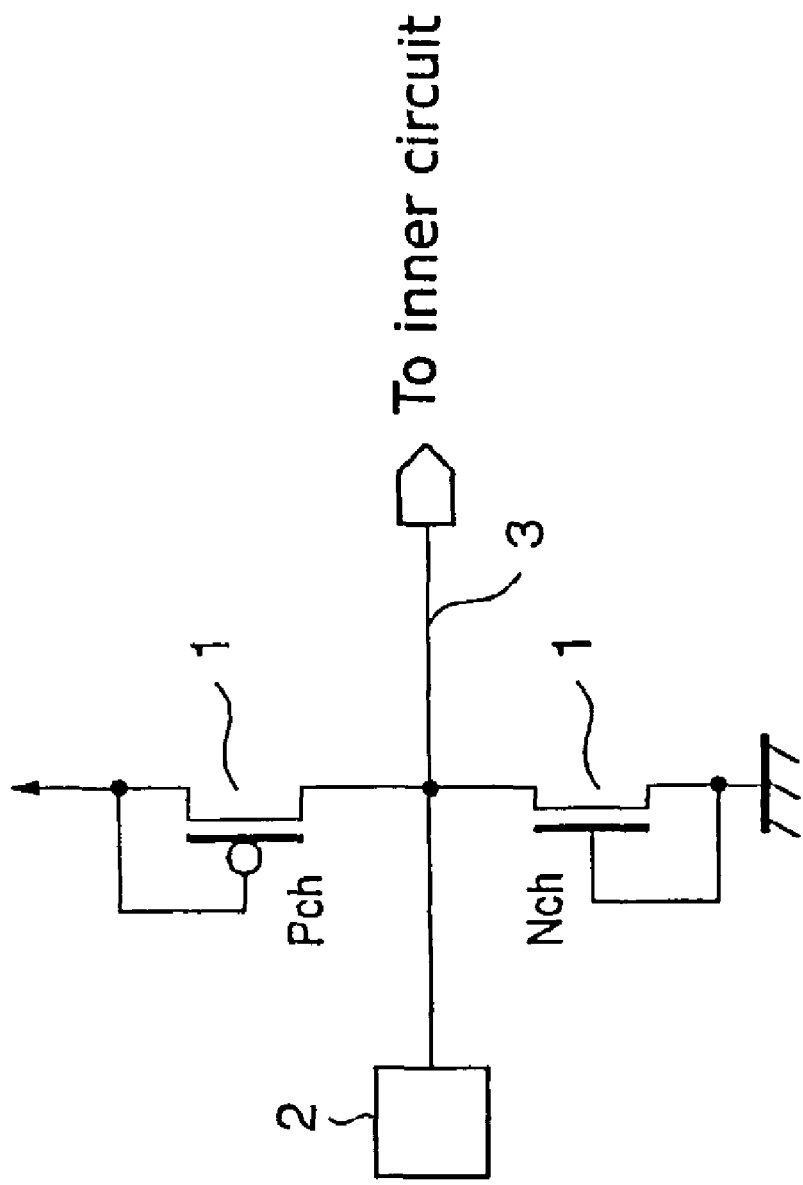
FIG. 14 is a schematic diagram of a conventional input circuit.

In FIG. 13, an input circuit according to the ninth embodiments has the same structure as in the eighth embodiment except that the transistors Pch-1 and Nch-1 forming the first electrostatic protection element 1 are connected to the wiring 3 through fuses 4.

The chip capacity is divided into the number of m, which is the lowest common multiple of o, p, and q so as to produce a chip commonly used for an o-chip package (package in which the chips in the number of o are mounted), p-chip package (package in which the chips in the number of p are mounted), and q-chip package (package in which the chips in the number of q are mounted).

That is, the junction area for producing the capacity equal to that of the conventional transistors Pch and Nch for the single chip package is divided equally into the number of m. Accordingly, the junction areas of the respective transistors Pch-1 to Pch-m and Nch-1 to Nch-m are 1/m of the junction area of the transistors Pch and Nch, respectively, for the single chip package.

The respective transistors Pch-1 to Pch-m and Nch-1 to Nch-m forming the second to m-th electrostatic protection elements 1 are connected to the wiring 3 through fuses 4.

When the semiconductor chip having the above structure is used in the single chip package (SCP), one chip is mounted in a package without disconnecting any fuse 4 so that all the electrostatic protection elements 1 in the number of m shown by an arrow A (from the first to m-th electrostatic protection elements 1) are electrically connected to the wiring 3.

When the chips in the number of o are mounted in a multi-chip package, the fuses 4 for the first to m/o-th electrostatic protection elements 1 shown by an arrow B are connected and the fuses 4 for the (m/o+1)th to m-th electrostatic protection elements 1 are disconnected.

When the chips in the number of p are mounted in a multi-chip package, the fuses 4 for the first to m/p-th electrostatic protection elements 1 shown by an arrow C are connected and the fuses 4 for the (m/p+1)th to m-th electrostatic protection elements 1 are disconnected.

When the chips in the number of q are mounted in a multi-chip package, the fuses 4 for the first to m/q-th electrostatic protection elements 1 shown by an arrow D are connected and the fuses 4 for the (m/q+1)th to m-th electrostatic protection elements 1 are disconnected.

More specifically, if o is two, p is three, and q is four, m is twelve. Accordingly, when the chips in the number of o or two chips are mounted, the fuses 4 for the first to sixth electrostatic protection elements 1 are connected and the fuses 4 for the seventh to twelfth electrostatic protection elements 1 are disconnected so that only the transistors Pch-1 to Pch-6 and Nch-1 to Nch-6 are used.

When the chips in the number of p or three chips are mounted, the fuses 4 for the first to fourth electrostatic protection elements 1 are connected and the fuses 4 for the fifth to twelfth electrostatic protection elements 1 are disconnected so that only the transistors Pch-1 to Pch-4 and Nch-1 to Nch-4 are used.

When the chips in the number of q or four chips are mounted, the fuses 4 for the first to third electrostatic protection elements 1 are connected and the fuses 4 for the fourth to twelfth electrostatic protection elements 1 are disconnected so that only the transistors Pch-1 to Pch-3 and Nch-1 to Nch-3 are used.

As described above, according to the present invention, since the input pin capacity of the multi-chip package is set at the same value as that of the single chip package, the specification of the input pin capacity is met and a semiconductor chip can be used commonly for the single chip and multi-chip packages.

The invention claimed is:

1. A semiconductor device, comprising:
    a semiconductor chip including an inner circuit, an input pad, and a wiring that connects the input pad to the inner circuit;
    a plurality of electrostatic protection elements connected to the wiring between the input pad and the inner circuit, each electrostatic protection element including a pair of transistors; and
    a fuse disposed between the wiring and at least one of the electrostatic protection elements so that the fuse is between the at least one electrostatic protection element and the inner circuit, the fuse being selectively disconnectable so as to selectively disconnect the at least one electrostatic protection element from wiring when more than one semiconductor chip is mounted in a package with the semiconductor chip and commonly connected to the input pad.

2. The semiconductor device according to claim 1, wherein said electrostatic protection elements include a first electrostatic protection element and a second electrostatic protection element, said fuse being disposed between the wiring and the second electrostatic protection element.

3. The semiconductor device according to claim 1, wherein said semiconductor chip includes a first semiconductor chip having a first wiring and a second semiconductor chip having a second wiring, said electrostatic protection elements respectively connected to the first wiring and the second wiring include a first electrostatic protection element and a second electrostatic protection element, and said fuse includes a first fuse and a second fuse, said first fuse being disposed between the first wiring and the second electrostatic protection element, said second fuse being disposed between the second wiring and the second electrostatic protection element so that the first fuse and second fuse are electrically disconnected.

4. The semiconductor device according to claim 1, wherein said semiconductor chip includes a first semiconductor chip having a first wiring and a second semiconductor chip having a second wiring, said electrostatic protection elements respectively connected to the first wiring and the second wiring include a first electrostatic protection element and a second electrostatic protection element, and said fuse includes first fuses and second fuses, said first fuses being disposed between the first wiring and the first electrostatic protection element and between the second wiring and the first electrostatic protection element, said second fuses being disposed between the first wiring and the second electrostatic protection element and the second wiring and the second electrostatic protection element so that at least ones of said first fuses and said second fuses being electrically disconnected.

5. The semiconductor device according to claim 1, wherein said semiconductor chip includes semiconductor chips in a number of n each having the wiring wherein n is an integer more than 3; said electrostatic protection elements respectively connected to the wirings includes first to n-th electrostatic protection elements; and said fuse includes second to n-th fuses respectively disposed between the wirings and the second to n-th electrostatic protection elements so that the second to n-th fuses are electrically disconnected.

6. The semiconductor device according to claim 1, wherein said semiconductor chip includes semiconductor chips in a number of n each having the wiring wherein n is an integer more than 3; said electrostatic protection elements respectively connected to the wirings includes first to n-th electrostatic protection elements; and said fuse includes first to n-th fuses respectively disposed between the wirings and the first to n-th electrostatic protection elements so that at least one of the first to n-th fuses are electrically connected.

7. The semiconductor device according to claim 1, wherein said semiconductor chip includes semiconductor chips in a number of n each having the wiring wherein n is an integer more than 3; said electrostatic protection elements respectively connected to the wirings includes first to n-th electrostatic protection elements; and said fuse includes first to n-th fuses respectively disposed between the wirings and the first to n-th electrostatic protection elements so that at least two of the first to n-th fuses are electrically connected.

8. The semiconductor device according to claim 1, wherein said semiconductor chip includes semiconductor chips in a number of o or p each having the wiring wherein o and p are integers more than 2; said electrostatic protection elements respectively connected to the wirings includes a first to m-th electrostatic protection elements wherein m is a lowest common multiple of o and p; and said fuse includes second to m-th fuses respectively disposed between the wirings and the second to m-th electrostatic protection elements so that the (m/o+1)-th to m-th fuses are electrically disconnected when the semiconductor chips are in the number of o, and the (m/p+1)-th to m-th fuses are electrically disconnected when the semiconductor chips are in the number of p.

9. The semiconductor device according to claim 1, wherein said semiconductor chip includes semiconductor chips in a number of o or p each having the wiring wherein o and p are integers more than 2; said electrostatic protection elements respectively connected to the wirings includes a first to m-th electrostatic protection elements wherein m is a lowest common multiple of o and p; and said fuse includes first to m-th fuses respectively disposed between the wirings and the first to m-th electrostatic protection elements disconnected when the semiconductor chips are in the number of o, and the (m/p+1)-th to m-th fuses are electrically disconnected when the semiconductor chips are in the number of p.

10. The semiconductor device according to claim 1, wherein each of said electrostatic protection elements includes a P-channel transistor and an N-channel transistor.

11. The semiconductor device according to claim 1, wherein each of said electrostatic protection elements includes a grounding portion connected to ground.

12. The semiconductor device according to claim 10, wherein at least one of said P-channel transistor and said N-channel transistor is connected to ground.

13. A device, comprising:
a pair of semiconductor chips, each semiconductor chip including an inner circuit, an input pad, and a wiring that connects the input pad to the inner circuit;
a first electrostatic protection element connected to the wiring at a first location between the input pad and the inner circuit;
a second electrostatic protection element selectively connected to the wiring at a second location, between the input pad and the inner circuit, downstream of the first location and the first electrostatic protection element; and
a pair of fuses respectively disposed between the wiring and different portions of the second electrostatic protection element so that the fuses are between the second electrostatic protection element and the inner circuit, the fuses being selectively disconnectable so as to selectively disconnect the second electrostatic protection element from the wiring,
wherein the input pads of the respective semiconductor chips are commonly connected to a common terminal.

* * * * *